(12) United States Patent
Tell et al.

(10) Patent No.: US 8,314,324 B2
(45) Date of Patent: Nov. 20, 2012

(54) LAMINATED THIN FILM PHOTOVOLTAIC SYSTEMS

(75) Inventors: Brian Tell, Ypsilanti, MI (US); Jeffery Peelman, Tiffin, OH (US)

(73) Assignee: Shadeplex, LLC, Toledo, OH (US)

( * ) Notice: Subject to any disclaimer, the term of this patent is extended or adjusted under 35 U.S.C. 154(b) by 793 days.

(21) Appl. No.: 12/340,542

(22) Filed: Dec. 19, 2008

(65) Prior Publication Data

US 2010/0154857 A1   Jun. 24, 2010

(51) Int. Cl.
   *H01L 31/042*   (2006.01)
(52) U.S. Cl. ........ 136/244; 136/251; 257/433; 257/457; 438/73; 438/80; 438/98
(58) Field of Classification Search ............... 136/244, 136/251; 257/433, 457; 438/73, 80, 98
   See application file for complete search history.

(56) References Cited

U.S. PATENT DOCUMENTS

| | | | |
|---|---|---|---|
| 3,308,577 A | 5/1964 | Holt |
| 4,234,907 A | 11/1980 | Daniel |
| 4,553,037 A | 11/1985 | Veazey |
| 4,579,536 A | 4/1986 | Cameron |
| 4,636,579 A | 1/1987 | Hanak et al. |
| 4,713,492 A | 12/1987 | Hanak |
| 4,768,738 A | 9/1988 | Weinert |
| 4,860,509 A | 8/1989 | Laaly et al. |
| 5,074,811 A | 12/1991 | Crisman |
| 5,131,341 A | 7/1992 | Newman |
| 5,192,944 A | 3/1993 | Otsuki et al. |
| 5,212,916 A | 5/1993 | Dippel et al. |
| 5,236,378 A | 8/1993 | Newman |
| 5,244,508 A | 9/1993 | Colozza |
| 5,280,270 A | 1/1994 | Correa et al. |
| 5,289,999 A | 3/1994 | Naujeck et al. |
| 5,336,119 A | 8/1994 | Lais et al. |
| 5,416,314 A | 5/1995 | Lopez-Calleja Lopez |
| 5,894,686 A | 4/1999 | Parker et al. |
| 5,968,287 A | 10/1999 | Nath |
| 5,969,501 A | 10/1999 | Glidden et al. |
| 6,000,353 A | 12/1999 | De Leu |
| 6,105,524 A | 8/2000 | Dane |
| 6,167,658 B1 | 1/2001 | Weiner |
| 6,224,016 B1 | 5/2001 | Lee et al. |

(Continued)

OTHER PUBLICATIONS

Des. 303,244 issued Sep. 5, 1989 to Hanak.

*Primary Examiner* — Jonathan Johnson
*Assistant Examiner* — Golam Mowla
(74) *Attorney, Agent, or Firm* — Fraser Clemens Martin & Miller LLC; Jacob M. Ward

(57) ABSTRACT

Flexible laminated thin film photovoltaic systems that include flexible support structures having a upper surface and a lower surface, at least one thin film photovoltaic module laminated to the upper surface of the flexible support structure, the at least one thin film photovoltaic module including lead wires and a flexible wiring conduit system attached to the lower side of the flexible support structure though which the lead wires of the at least one thin film photovoltaic module are routed. The peripheral edges of the thin film photovoltaic modules and adjacent surrounding portions of the flexible support structure are laminated with flexible strip members which prevent the peripheral edges of the thin film photovoltaic modules from peeling off the flexible support structure.

16 Claims, 3 Drawing Sheets

U.S. PATENT DOCUMENTS

| | | |
|---|---|---|
| 6,237,521 B1 | 5/2001 | Muller |
| 6,295,818 B1 | 10/2001 | Ansley et al. |
| 6,313,438 B1 | 11/2001 | Emerick, Jr. |
| 6,397,869 B1 | 6/2002 | Jennings |
| 6,420,645 B1 | 7/2002 | Ohtsuka et al. |
| 6,455,767 B1 | 9/2002 | Muller |
| 6,491,051 B2 | 12/2002 | Pierce et al. |
| 6,553,729 B1 | 4/2003 | Nath et al. |
| 6,604,840 B2 | 8/2003 | Watson |
| 6,855,016 B1 | 2/2005 | Jansen |
| 6,913,713 B2 | 7/2005 | Chittibabu et al. |
| 7,047,902 B1 | 5/2006 | Little |
| 7,217,015 B2 | 5/2007 | Cocciardi |
| 7,229,203 B2 | 6/2007 | Lath |
| 7,342,171 B2 | 3/2008 | Khouri et al. |
| 2004/0083633 A1 | 5/2004 | Mueller |
| 2005/0164627 A1 | 7/2005 | Boone, Jr. |
| 2006/0023446 A1 | 2/2006 | Racoosin |
| 2006/0028166 A1 | 2/2006 | Closset et al. |
| 2006/0102217 A1 | 5/2006 | Hsiang |
| 2006/0112601 A1 | 6/2006 | Childress |
| 2006/0272692 A1 | 12/2006 | Wu |
| 2007/0006907 A1 | 1/2007 | Yueh |
| 2007/0044346 A1 | 3/2007 | Ungari et al. |
| 2007/0056617 A1 | 3/2007 | Li |
| 2007/0151588 A1 | 7/2007 | Yul et al. |
| 2007/0151593 A1* | 7/2007 | Jaynes ..................... 136/244 |
| 2007/0234945 A1 | 10/2007 | Khouri et al. |

* cited by examiner

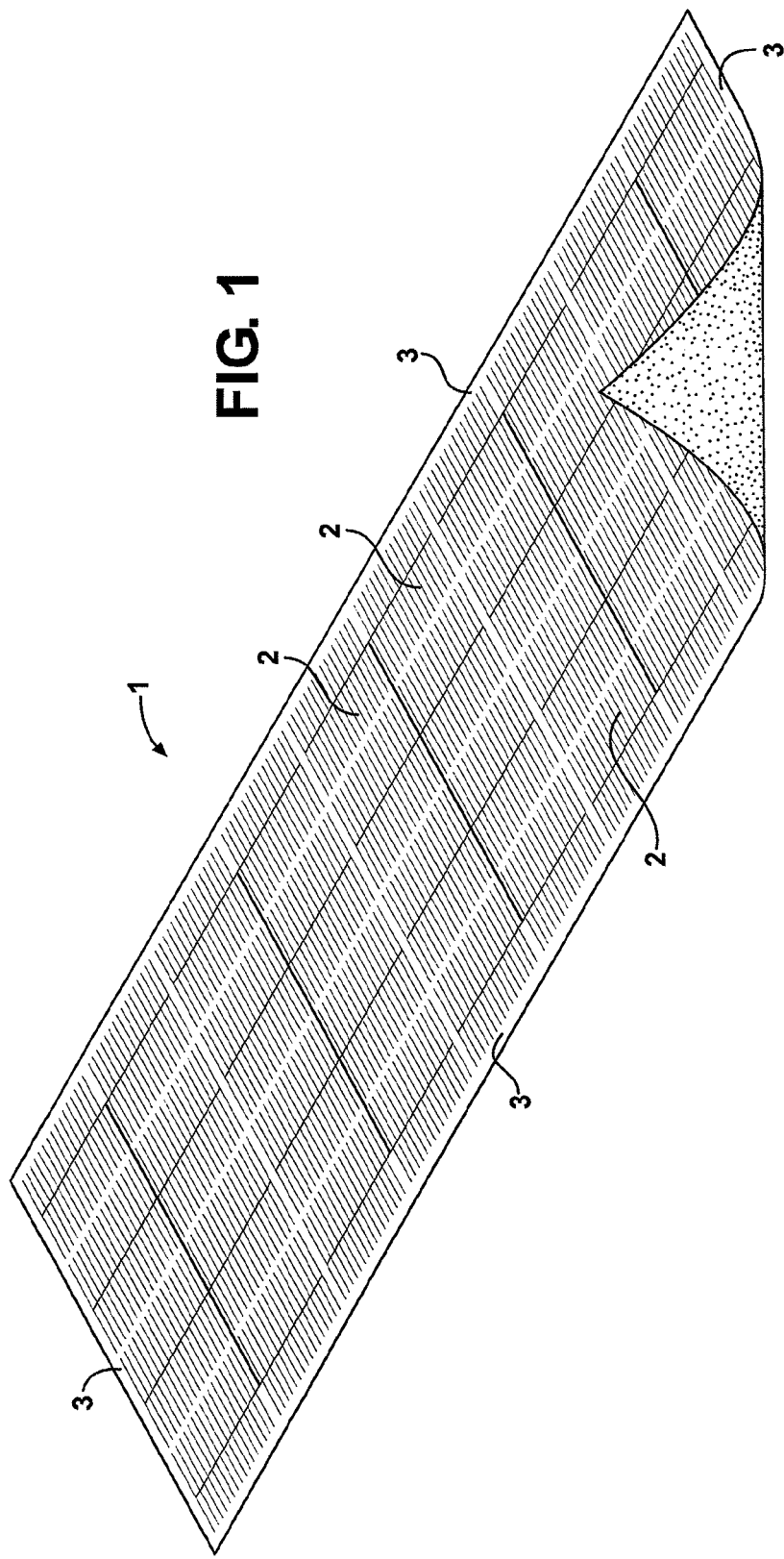
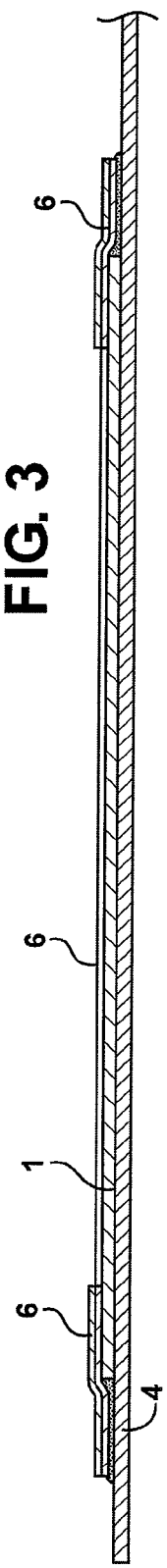

US 8,314,324 B2

LAMINATED THIN FILM PHOTOVOLTAIC SYSTEMS

TECHNICAL FIELD

The present invention relates to flexible thin film photovoltaic modules and more particularly is directed to methods of incorporating such flexible thin film photovoltaic modules onto various flexible support structures.

BACKGROUND ART

Solar cells or photovoltaic cells are wide area electronic devices that convert solar energy into electricity by the photovoltaic effect. Assemblies of solar or photovoltaic cells are used to make solar modules, or photovoltaic arrays.

Solar modules and photovoltaic arrays have many applications. One common application is for powering small devices such as electronic calculators. Photovoltaic arrays generate a form of renewable electricity and are therefore particularly useful in situations where electrical power from a grid is unavailable such as in remote area power systems, Earth-orbiting satellites and space probes, remote radiotelephones and water pumping applications. Photovoltaic electricity is also increasingly deployed in grid-tied electrical systems.

Solar cells are often electrically connected and encapsulated as a module. Photovoltaic modules often have a sheet of glass on the front (sun up) side, allowing light to pass while protecting the semiconductor wafers from the elements (rain, hail, etc.). Solar cells are also usually connected in series in modules, creating an additive voltage. Connecting cells in parallel will yield a higher current. Modules are then interconnected, in series or parallel, or both, to create an array with the desired peak DC voltage and current.

Recent improvements to photovoltaic modules have come about with the advent of thin film technologies. In particular flexible amorphous photovoltaic modules eliminate the previous constraints of solid, rigid substrates and open the door for many new applications to be developed.

The present invention provides novel uses of flexible thin film photovoltaic modules and particularly provides methods of incorporating such flexible thin film photovoltaic modules onto various flexible support structures.

DISCLOSURE OF THE INVENTION

According to various features, characteristics and embodiments of the present invention which will become apparent as the description thereof proceeds, the present invention provides a flexible laminated thin film photovoltaic system which comprises:

a flexible support structure having an upper surface and a lower surface;

at least one thin film photovoltaic module laminated to the upper surface of the flexible support structure, the at least one thin film photovoltaic module including lead wires; and a flexible wiring conduit system attached to the lower side of the flexible support structure though which the lead wires of the at least one thin film photovoltaic module are routed.

According to various embodiments of the present invention, the flexible support structure comprises a fabric, including a woven or non-woven fabric.

To form the laminates, one or more thin film photovoltaic modules are laminated to the upper surface of the flexible support structure by means of an adhesive. In addition, peripheral edges of the thin film photovoltaic modules and adjacent surrounding portions of the flexible support structure are laminated with flexible strip members to prevent the peripheral edges of the thin film photovoltaic modules from peeling off the flexible support structure.

According to one embodiment the flexible wiring conduit system comprises an outer conduit system and an inner conduit system within the outer conduit system. In further embodiments, the outer conduit system is made from a fabric material and the inner conduit system is made from a plastic material.

The flexible wiring conduit system can include a main conduit portion and connector portions that extend from the main conduit portion. The connector portions include ends that are coupled to the lower surface of the flexible support structure. The ends of the connector portions are aligned with passageways that extend through the flexible support structure so that wires of the thin film photovoltaic modules can pass through the passageways and into the wiring conduit system. In one embodiment, hanger supports can be coupled between the flexible support structure and the flexible wiring conduit system.

In further embodiments the flexible thin film laminated photovoltaic systems of the present invention can comprise part of an architectural structure.

BRIEF DESCRIPTION OF DRAWINGS

The present invention will be described with reference to the attached drawings which are given as non-limiting examples only, in which:

FIG. 1 is a perspective view of a commercially available flexible thin film photovoltaic module.

FIG. 3 is a cross sectional view of the laminated thin film photovoltaic system taken along section lines III-III in FIG. 2.

BEST MODE FOR CARRYING OUT THE INVENTION

Figure 2:
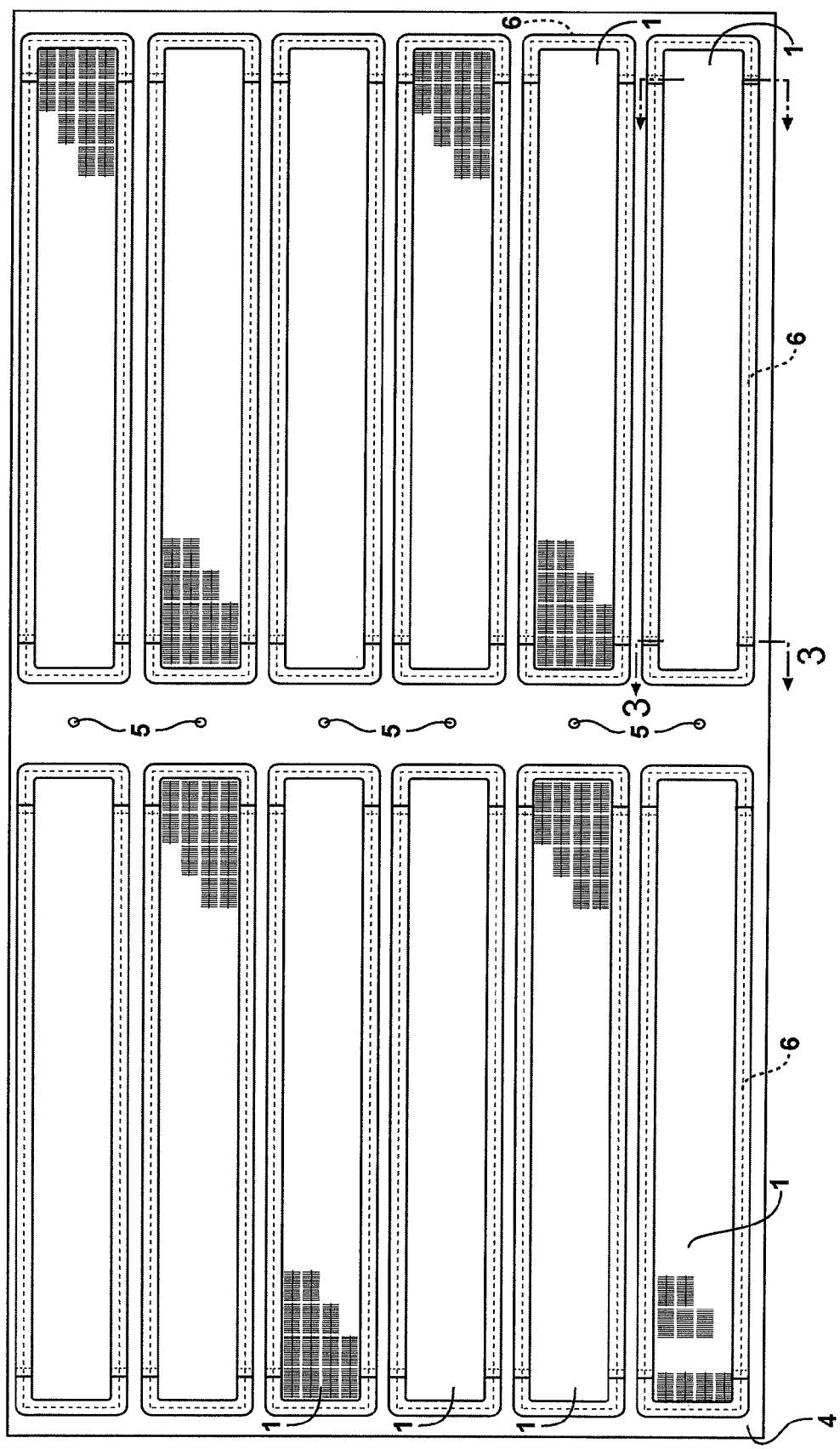
FIG. 2 is a top view of laminated thin film photovoltaic system according to one embodiment of the present invention.

The present invention is directed to flexible thin film photovoltaic modules and more particularly is directed to methods of incorporating such flexible thin film photovoltaic modules onto various flexible support structures.

The present invention provides laminated thin film photovoltaic systems which include a flexible substrate support that carry any number of flexible thin film photovoltaic modules which are securely laminated or incorporated onto the flexible support. The resulting photovoltaic module array is electrically connected in either series or parallel (depending on the photovoltaic modules used) to create a specific power output, for example, 200, 400, 600, 800 1,000 watts, etc.

The unique flexible substrate supported photovoltaic systems employ a lamination design/structure that eliminates possible "peeling" or de-lamination of the thin-film photovoltaic modules from the fabric. Virtually any type of commercially available woven or non-woven fabrics can be used according to the present invention. Alternatively, sheets or films of materials such as plastics, elastomers, rubbers, etc. which can be reinforced and for purposes of the present invention are sufficiently sturdy or thick to support the laminated thin film photovoltaic systems of the present invention can be used in place of fabrics. Therefore reference herein to fabric should not be interpreted as excluding sheets or films of materials such as plastics, elastomers, rubbers, etc. In general, the lamination methods used according to the present invention involve the use of adhesives to secure the thin-film photovoltaic modules to the fabric supports. Because commercially available fabrics frequently have specially formulated polymer coatings applied to both surfaces to provide protection against moisture, temperature extremes, ultra-violet wavelength light from the sun, smog exposure, etc., and because these polymer coating formulations are different and no uniform industry standard has been adopted for the chemical formulations used in the coatings, the thin-film photovoltaic module lamination techniques employed according to the present invention can vary somewhat in the type of adhesive used for a particular commercial fabric.

Exemplary lamination techniques that can be used according to the present invention include, but will not be limited to, the use of a broad range of hot melt adhesive formulations that are known to be used in conjunction with fabrics, the use of industrial based adhesive tape materials, flexible cynoacrylates, and the use of other fabric membrane materials.

FIG. 1 is a perspective view of a commercially available flexible thin film photovoltaic module. The exible thin film photovoltaic module 1 includes a number of unit cells 2 which are typically arranged in bidirectional arrays on the underlying plastic film substrate. The peripheral edges 3 of the thin film photovoltaic module 1 are referred to herein as non-functional areas, because they do not include unit cells and do not function to produce a power output. One end of the flexible thin film photovoltaic module 1 includes wire leads (not shown) through which the DC output of the flexible thin film photovoltaic modules can be harvested.

FIG. 2 is a top view of laminated thin film photovoltaic system according to one embodiment of the present invention. The laminated thin film photovoltaic system shown in FIG. 2 includes an underlying fabric support 4 and a plurality of thin film photovoltaic modules 1. The plurality of thin film photovoltaic modules 1 are arranged in a bidirectional array in the embodiment shown in FIG. 2. However, it is to be understood that the thin film photovoltaic modules 1 could be arranged in any desired pattern. Likewise, it is noted that while the fabric support 4 is shown as having a rectangular shape, the present invention is not limited to the fabric support 4 having any particular shape. In the laminated thin film photovoltaic system shown in FIG. 2, passageways 5 are provided in the fabric support 4 for the lead wires (not shown) of the thin film photovoltaic modules 1 to pass through. These passageways 5 could be defined by grommets that are fixed in or to the fabric support 4, if desired. Alternatively, the passageways 5 could comprises slits or openings in the fabric support 4 that are covered by an overlapping cover such as an auxiliary piece or patch or flap of fabric. As can be understood from FIG. 2, the passageways 5 and thin film photovoltaic modules 1 are aligned and configured so that lead wires from thin film photovoltaic modules 1 on opposed sides of each of the passageways 5 can received in a common passageway 5. This arrangement allows for the use of a common wire conduit system as discussed below. In other embodiments the thin film photovoltaic modules 1 and passageways 5 can be arranged in any desired configuration.

The peripheral edges of the thin film photovoltaic modules 1 are covered by a fabric strip 6 which is laminated both over the peripheral edges of the thin film photovoltaic modules 1 and a surrounding portion of the underlating fabric support 4.

FIG. 3 is a cross sectional view of the laminated thin film photovoltaic system taken along section lines III-III. The thin film photovoltaic module 1 shown in FIG. 3 is attached to fabric support 4 by an adhesive. Although there is no particular limitation on the type of adhesive that can be used apart from the adhesive being suitable for the flexible application of the resulting laminated thin film photovoltaic systems, heat sealing, heat setting, hot melt, pressure sensitive and contact adhesives have particular characteristics that make them suitable for manufacturing the laminated thin film photovoltaic systems of the present invention. In the case of hot melt and other adhesives, application of the adhesives to the fabric support 4 and/or the thin-film photovoltaic modules 1 can be achieved using a roll style machine in which the adhesive first coats a spinning roller and then is transferred from the roller to the fabric support 4 and/or the thin-film photovoltaic modules 1. Other conventional methods can be used to apply the adhesives to the fabric support and/or the thin-film photovoltaic module, including spraying, brushing, printing, etc.

In order to prevent the thin film photovoltaic modules 1 from delaminating or peeling off the fabric support 4, the peripheral edges of the thin film photovoltaic modules 1 are covered by a fabric strip 6 which is laminated both over the peripheral edges of the thin film photovoltaic modules 1 and a surrounding portion of the underlating fabric support 4 as noted above. It is noted here that the peripheral edges of the thin film photovoltaic modules 1 that are covered by the fabric strip 6 do not include unit cells 2 and therefore are non-functional areas of the thin film photovoltaic modules 1, i.e. areas that do not convert light into energy.

The fabric strips 6 are attached to the peripheral edges of the thin film photovoltaic modules 1 and a surrounding portion of the underlating fabric support 4 by a suitable adhesive, including heat sealing, heat setting, hot melt, pressure sensitive, contact adhesives, etc. In addition, a sealing material is provided between the outer portion of the fabric strip 6 that overlays the underlying fabric support 4 and the fabric support 4 to prevent moisture from passing beneath the fabric strip 6. The sealing material should preferably be of a type that has a high resistance to ultraviolet radiation. Where as one fabric strip 6 is referred to for a given thin film photovoltaic module 1, it is to be understood that either a single, rectangular, frame-shaped fabric strip 6 could be used or a plurality of fabric strips 6, with one or more along each edge of a thin film photovoltaic module 1. It is noted that in FIG. 3 the fabric strips 6 are shown as overlapping one another at the corners for embodiments in which separate fabric strips 6 are use along each side of the laminated thin film photovoltaic systems. The manner in which the fabric strips 6 overlap is also shown in FIG. 2.

Figure 4:
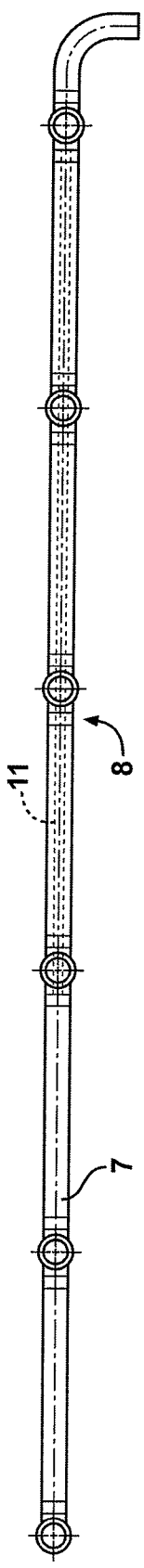
FIG. 4 is a top view of a wiring conduit system according to one embodiment of the present invention.
Figure 5:
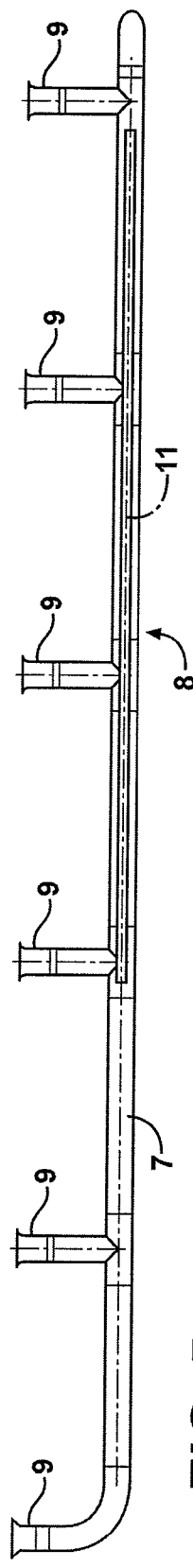
FIG. 5 is a side view of the wiring conduit system of FIG. 4.

FIG. 4 is a top view of a wiring conduit system according to one embodiment of the present invention. FIG. 5 is a side view of the wiring conduit system of FIG. 4. The manner of routing and protecting the wiring system for the laminated thin film photovoltaic systems of the present invention requires compliance with standards that are necessary for safety certification, such as UL. In this regard, the wiring system is designed to be contained within a protective conduit system and a fabric conduit system which secures the wiring system to the laminated thin film photovoltaic systems. The wiring conduit system shown in FIGS. 4 and 5 includes an outer fabric conduit system 7 that is attached to the under side of the fabric support 4 and is flexible so as to conform to the shape of the overall laminated thin film photovoltaic systems. In this regard, the outer fabric conduit system 7 can be made from any suitable woven or non-woven fabric material that can be coated with a polymer (or materials such as plastics, elastomers, rubbers, etc.). The outer fabric conduit system 7 includes a main conduit section 8 from which a plurality of conduit connector portions 9 extend. As discussed below, the free ends 10 of the conduit connector portions 9 shown in FIGS. 4 and 5 are coupled to the underside of a fabric support 4 so that the centers of the conduit connector portions 9 are aligned with the passageways 5 formed in the fabric support 4.

The wiring conduit system shown in FIGS. 4 and 5 includes an inner flexible conduit system 11 that is located within the outer fabric conduit system 7. The inner flexible conduit system 11 can extend through the main conduit section 8 as shown and can further extend into the conduit connector portions 9. The inner flexible conduit system 11 is made from a plastic material such as a thin wall PVC extrusion and is provided to protect the wires of the laminated thin film photovoltaic systems.

When assembled the lead wires of each of the flexible thin film photovoltaic modules 1 pass through the passageways 5 formed in the fabric support 5 and into the underlying, connected conduit connector portions 8 of the fabric conduit system 7 and into the inner flexible conduit system 11. At this point, the lead wires could each extend through the main conduit section 8 within the inner flexible conduit system 11 and to a main DC power distribution panel or a DC power output connector (not shown). Alternatively, the lead wires for each of the individual flexible thin film photovoltaic modules 1 could be coupled to main lead wires that extend through the main conduit section 8 within the inner flexible conduit system 11 and to a main DC power distribution panel or a DC power output connector (not shown). The utilization of high voltage output thin-film modules according to the present invention can produce power at a very low electrical current (below 1 Amp). This allows the use of small gauge wire (such as 24 AWG) that has greater flexibility than larger wire gauges.

Figure 6:
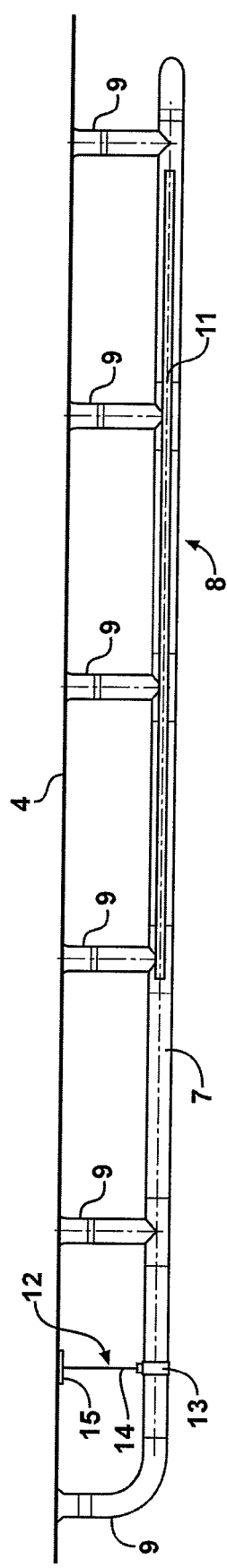
FIG. 6 is a side view of the wiring conduit system attached to the under side of a laminated thin film photovoltaic system according to one embodiment of the present invention.

FIG. 6 is a side view of the wiring conduit system attached to the under side of a laminated thin film photovoltaic system according to one embodiment of the present invention. The free ends 10 of the conduit connector portions 9 of the outer fabric conduit system 7 are flared out and attached to the under side of the fabric support 4 so that the centers of the conduit connector portions 9 and any inner flexible conduit system 11 therein are aligned with the passageways 5. One manner of attaching the flared ends of the conduit connector portions 9 to the underside of the fabric support 4 is to heat weld the flared ends of the conduit connector portions 9 to the underside of the fabric support 4. Other means for attaching the flared ends of the conduit connector portions 9 to the underside of the fabric support 4 can include the use of various adhesives such as heat setting, hot melt, pressure sensitive and contact adhesives. It is also possible to use mechanical means such as clips or fasteners to attach the flared ends of the conduit connector portions 9 to the underside of the fabric support 4.

In addition to attaching the flared ends of the conduit connector portions 9 to the underside of the fabric support 4 to support the wiring conduit system, FIG. 6 illustrates a hanger support 12 that positioned on the main conduit section 8 between two of the conduit connector portions 9. The hanger support 12 includes a strap or sling 13 that is coupled to the main conduit section 8 and a tether 14 that is coupled between the strap or sling 13 and the fabric support 4. In the illustrated embodiment, the tether 14 extends through the fabric support 4 and is coupled to a disk 15 on the upper side of the fabric support 4. The disk 15 can be made from any suitable material such as a fabric, a plastic material, a metal, etc. In alternative embodiments, the tether 14 could be coupled to the lower side of the fabric support 4. The strap or sling 13 can be made from any suitable material as a fabric, a plastic material, a metal, etc. The strap or sling 13 can be coupled to the main conduit section 8 by a suitable adhesive, if desired. It is to be understood that while one hanger support 12 is shown in FIG. 6 any number of hanger supports 12 can be used.

The laminated thin film photovoltaic systems of the present invention can be incorporated into or used as various architectural structural elements, such as but not limited to, frames, clearspans, inflatable tension structures, outdoor shade structures, shades, awnings, canopies, banners, billboards and other signage, tents, tarps, swimming pool covers sails, and other types of structures that are made from fabrics, including wing and stabilizer surfaces of ultra light and other aircraft. In addition, the laminated thin film photovoltaic systems of the present invention can be incorporated into curtains, draperies, window shades, umbrellas, backpacks, and articles of clothing. These are non-limiting examples of uses to which the laminated thin film photovoltaic systems of the present invention can be put.

The fabric supports for the laminated thin film photovoltaic systems of the present invention can be any type of woven or non-woven fabric as well as sheets or films of materials such as plastics, elastomers, rubbers, etc. which are sufficiently sturdy or thick to support the laminated thin film photovoltaic systems of the present invention. As noted herein, reference herein to fabric should not be interpreted as excluding sheets or films of materials such as plastics, elastomers, rubbers, etc. This applies to the support fabric, the fabric strips that are laminated on the edges of the thin film photovoltaic modules and the outer fabric conduit system.

The thin film photovoltaic modules of the laminated thin film photovoltaic systems can be electrically connected in either series or parallel to provide a specific power output, for example, 200, 400, 600, 800 and 1,000 watts.

Although the present invention has been described with reference to particular means, materials and embodiments, from the foregoing description, one skilled in the art can easily ascertain the essential characteristics of the present invention and various changes and modifications can be made to adapt the various uses and characteristics without departing from the spirit and scope of the present invention as described above.

What is claimed is:

1. A flexible laminated thin film photovoltaic system, comprising:
   a flexible support structure having an upper surface and a lower surface, and a plurality of passageways formed therethrough;
   a plurality of thin film photovoltaic modules disposed on the upper surface of the flexible support structure, each of the thin film photovoltaic modules including lead wires and having a peripheral edge, the lead wires disposed through the passageways, at least one of the passageways being a common passageway disposed between the peripheral edges of a pair of the thin film photovoltaic modules, the lead wires from the pair of thin film photovoltaic modules on opposed sides of the common passageway received by the common passageway; and
   a flexible wiring conduit system attached to the lower surface of the flexible support structure and in communication with the passageways of the flexible support structure, the lead wires of the at least one thin film photovoltaic module routed into the flexible wiring conduit system.

2. The flexible laminated thin film photovoltaic system according to claim 1, wherein the flexible support structure comprises a fabric.

3. The flexible laminated thin film photovoltaic system according to claim 2, wherein the fabric comprises a woven or non-woven fabric.

4. The flexible laminated thin film photovoltaic system according to claim 2, further comprising a plurality of fabric strip members, each of the fabric strip members disposed over at least a portion of the peripheral edge of one of the thin film photovoltaic modules and a surrounding portion of the upper surface of the flexible fabric support structure, the fabric strip members attached to the peripheral edges of the thin film photovoltaic modules and the surrounding portions of the upper surface of the flexible fabric support structure with an adhesive to prevent a peeling off of the thin film photovoltaic modules from the fabric support structure, the adhesive disposed between the fabric strip members and the peripheral edges of the thin film photovoltaic modules and between the fabric strip members and the surrounding portions of the upper surface of the flexible fabric support structure.

5. The flexible laminated thin film photovoltaic system according to claim 1, wherein the flexible wiring conduit system comprises an outer conduit system and an inner conduit system within the outer conduit system.

6. The flexible laminated thin film photovoltaic system according to claim 5, wherein the outer conduit system is made from a fabric material and the inner conduit system is made from a plastic material.

7. The flexible laminated thin film photovoltaic system according to claim 1, wherein the flexible wiring conduit system comprises a main conduit portion and at least one connector portion that extends from the main conduit portion.

8. The flexible laminated thin film photovoltaic system according to claim 7, wherein ends of the at least one connector portion are coupled to the lower surface of the flexible support structure.

9. The flexible laminated thin film photovoltaic system according to claim 1, further comprising at least one hanger support coupled between the flexible support structure and the flexible wiring conduit system.

10. The flexible laminated thin film photovoltaic system according to claim 1 which comprises part of an architectural structure.

11. A flexible laminated thin film photovoltaic system, comprising:
a flexible support structure having an upper surface and a lower surface, and a plurality of passageways formed therethrough;
a plurality of thin film photovoltaic modules disposed on the upper surface of the flexible support structure, each of the plurality of thin film photovoltaic modules including lead wires, the lead wires disposed through the passageways; and
a flexible wiring conduit system attached to the lower surface of the flexible support structure through which the lead wires of the plurality of thin film photovoltaic modules are routed, the flexible wiring conduit system including a main conduit section having an outer conduit system and an inner conduit system within the outer conduit system, a plurality of conduit connector portions extending from the main conduit section, the conduit connector portions in communication with the passageways of the flexible support structure, the conduit connector portions having flared out free ends attached to the lower surface of the flexible support structure and aligning the conduit connector portions with the passageways.

12. The flexible laminated thin film photovoltaic system according to claim 11, wherein the plurality of thin film photovoltaic modules are arranged in a bidirectional array.

13. The flexible laminated thin film photovoltaic system according to claim 11, wherein the flexible support structure comprises a fabric.

14. The flexible laminated thin film photovoltaic system according to claim 13, further comprising a plurality of fabric strip members, each of the fabric strip members disposed over at least a portion of the peripheral edge of one of the thin film photovoltaic modules and a surrounding portion of the upper surface of the flexible fabric support structure, the fabric strip members attached to the peripheral edges of the thin film photovoltaic modules and the surrounding portions of the upper surface of the flexible fabric support structure with an adhesive to prevent a peeling off of the thin film photovoltaic modules from the fabric support structure, the adhesive disposed between the fabric strip members and the peripheral edges of the thin film photovoltaic modules and between the fabric strip members and the surrounding portions of the upper surface of the flexible fabric support structure.

15. The flexible laminated thin film photovoltaic system according to claim 11, wherein the flexible support structure includes a plurality of passageways therethrough which are in communication with the flexible wiring conduit system.

16. A flexible laminated thin film photovoltaic system, comprising:
a flexible fabric support structure having an upper surface and a lower surface, and a plurality of passageways formed therethrough;
a plurality of thin film photovoltaic modules disposed on the upper surface of the flexible fabric support structure, each of the thin film photovoltaic modules including lead wires and having a peripheral edge, the lead wires disposed through the passageways;
a plurality of fabric strip members, each of the fabric strip members disposed over at least a portion of the peripheral edge of one of the thin film photovoltaic modules and a surrounding portion of the upper surface of the flexible fabric support structure, the fabric strip members attached to the peripheral edges of the thin film photovoltaic modules and the surrounding portions of the upper surface of the flexible fabric support structure with an adhesive to prevent a peeling off of the thin film photovoltaic modules from the fabric support structure, the adhesive disposed between the fabric strip members and the peripheral edges of the thin film photovoltaic modules and between the fabric strip members and the surrounding portions of the upper surface of the flexible fabric support structure; and
a flexible wiring conduit system attached to the lower surface of the flexible fabric support structure and in communication with the passageways of the flexible support structure, the lead wires of the at least one thin film photovoltaic module routed into the flexible wiring conduit system.

* * * * *